United States Patent
Hung et al.

(10) Patent No.: US 7,663,433 B2
(45) Date of Patent: Feb. 16, 2010

(54) AUDIO AMPLIFIER

(75) Inventors: Chun-Lung Hung, Taipei Hsien (TW); Wen-Ming Chen, Shenzhen (CN); Jie Liu, Shenzhen (CN); De-An Zhang, Shenzhen (CN); Wang-Chang Duan, Shenzhen (CN); Tao Wang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 12/187,402

(22) Filed: Aug. 7, 2008

(65) Prior Publication Data

US 2009/0115511 A1    May 7, 2009

(30) Foreign Application Priority Data

Nov. 2, 2007   (CN) .................... 2007 1 0202367

(51) Int. Cl.
*H03F 1/14* (2006.01)

(52) U.S. Cl. ........................................ 330/51; 381/94.5
(58) Field of Classification Search ................. 330/10, 330/251, 207 A, 285, 296, 51; 381/94.5
See application file for complete search history.

(56) References Cited

U.S. PATENT DOCUMENTS 5,081,426 A *   1/1992   Imanishi ..................... 330/296
6,573,787 B2    6/2003   Ikin

* cited by examiner

*Primary Examiner*—Robert Pascal
*Assistant Examiner*—Hieu P Nguyen
(74) *Attorney, Agent, or Firm*—Frank R. Niranjan

(57) ABSTRACT

An audio amplifier is provided. The audio amplifier includes an amplifier, a biasing circuit, and a time-delay circuit. The amplifier circuit is for amplifying audio signals. The biasing circuit is for providing a bias voltage to the amplifier circuit to actuate the amplifier circuit. The time-delay circuit is for receiving a pulse signal and delaying the bias voltage to avoid a sudden actuation of the amplifier circuit based on the pulse signal. The time-delay circuit comprises a first input for receiving the pulse signal, a first resistor coupled to the first input, a first output coupled to the biasing circuit, a first BJT whose base, emitter, collector are respectively coupled to the first resistor, ground, and the first output.

10 Claims, 4 Drawing Sheets

AUDIO AMPLIFIER

BACKGROUND

1. Field of the Invention

The present invention generally relates to audio amplifiers, and more particularly to an audio amplifier that is capable of eliminating audible noise.

2. Description of Related Art

Audio amplifiers are used in various audio players, such as moving picture experts group audio layer 3 (MP3) players, digital versatile disc (DVD) players, televisions and so on, for amplifying audio signals and transmitting amplified audio signals to external speakers. An audio amplifier includes an amplifier circuit for amplifying the audio signals and a biasing circuit for providing a bias voltage to actuate the amplifier circuit. However, in practice, static noise such as a popping sound is always generated the moment the amplifier circuit suddenly receives the bias voltage.

Therefore, an audio amplifier is needed in the industry to address the aforementioned deficiency.

SUMMARY

An audio amplifier is provided. The audio amplifier includes an amplifier, a biasing circuit, and a time-delay circuit. The amplifier circuit is for amplifying audio signals. The biasing circuit is for providing a bias voltage to the amplifier circuit to actuate the amplifier circuit. The time-delay circuit is for receiving a pulse signal and delaying the bias voltage to avoid a sudden actuation of the amplifier circuit.

Other advantages and novel features of the present invention will become more apparent from the following detailed description of preferred embodiment when taken in conjunction with the accompanying drawings.

DETAILED DESCRIPTION

Figure 1:
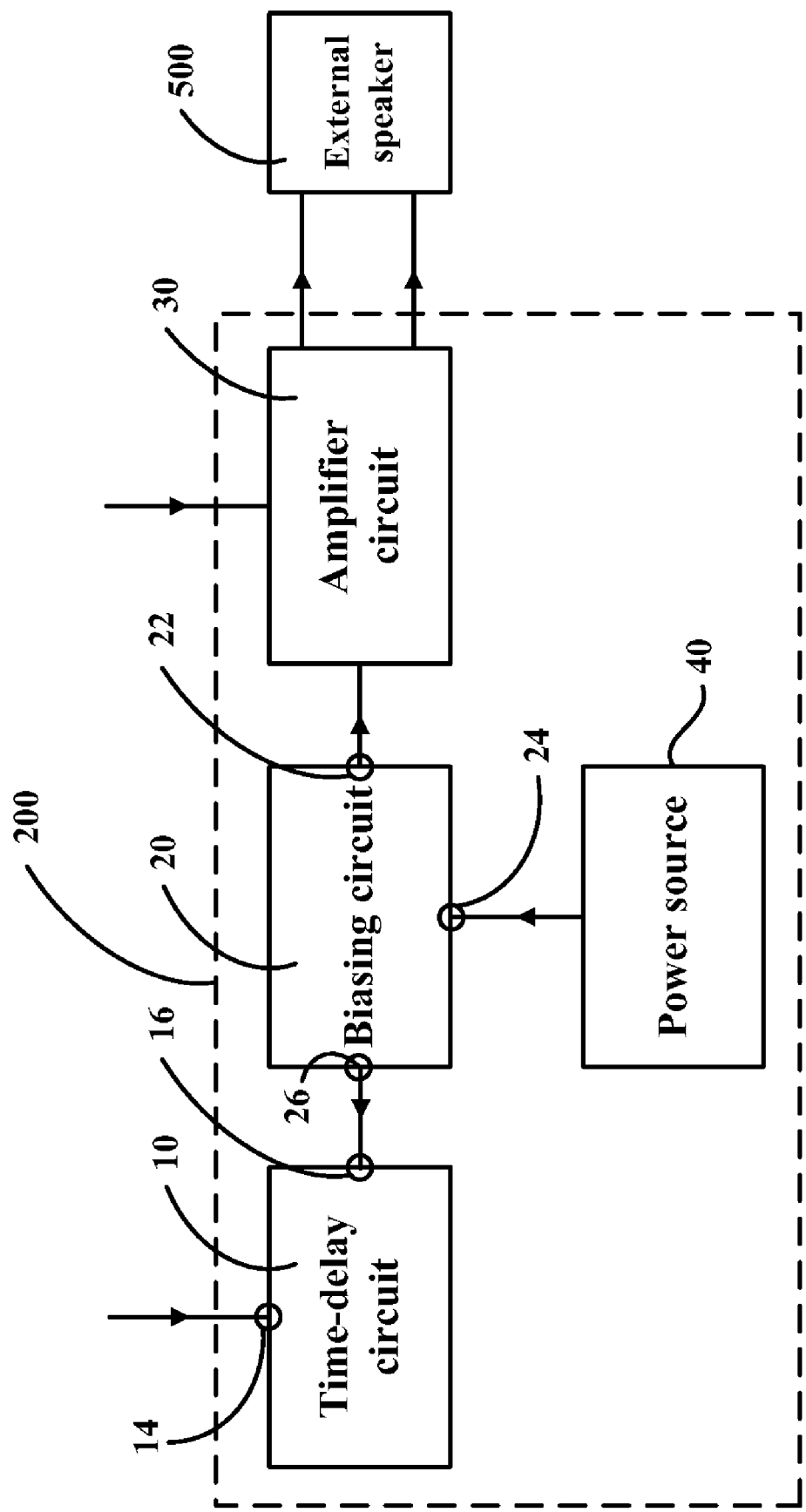
FIG. 1 is a block diagram showing an audio amplifier in accordance with a first exemplary embodiment, and the audio amplifier includes a time-delay circuit and a biasing circuit.

Referring to FIG. 1, an audio amplifier 100 in accordance with a first exemplary embodiment is used for receiving audio signals, amplifying the audio signals and transmitting amplified audio signals to an external speaker 500. The audio amplifier 100 includes a time-delay circuit 10, a biasing circuit 20, an amplifier circuit 30, and a power source 40. A first input 14 and a first output 16 of the time-delay circuit 10 are coupled to a controller (not shown) and the biasing circuit 20 respectively. A second input 24, a third input 26, and a second output 22 of the biasing circuit 20 are coupled to the power source 40, the first output 16, and the amplifier circuit 30, respectively. The amplifier circuit 30 is further coupled to the external speaker 500 and other components (not shown) for providing the audio signals.

The biasing circuit 20 receives power supplied from the power source 40 via the second input 24, and generates a bias voltage. The time-delay circuit 10 receives a positive pulse signal 50 via the first input 14, and delays the bias voltage depending on the positive pulse signal 50 to avoid a sudden actuation of the amplifier circuit 30. The amplifier circuit 30 amplifies the audio signals and transmits amplified audio signals to the external speaker 500 when actuated.

Figure 2:
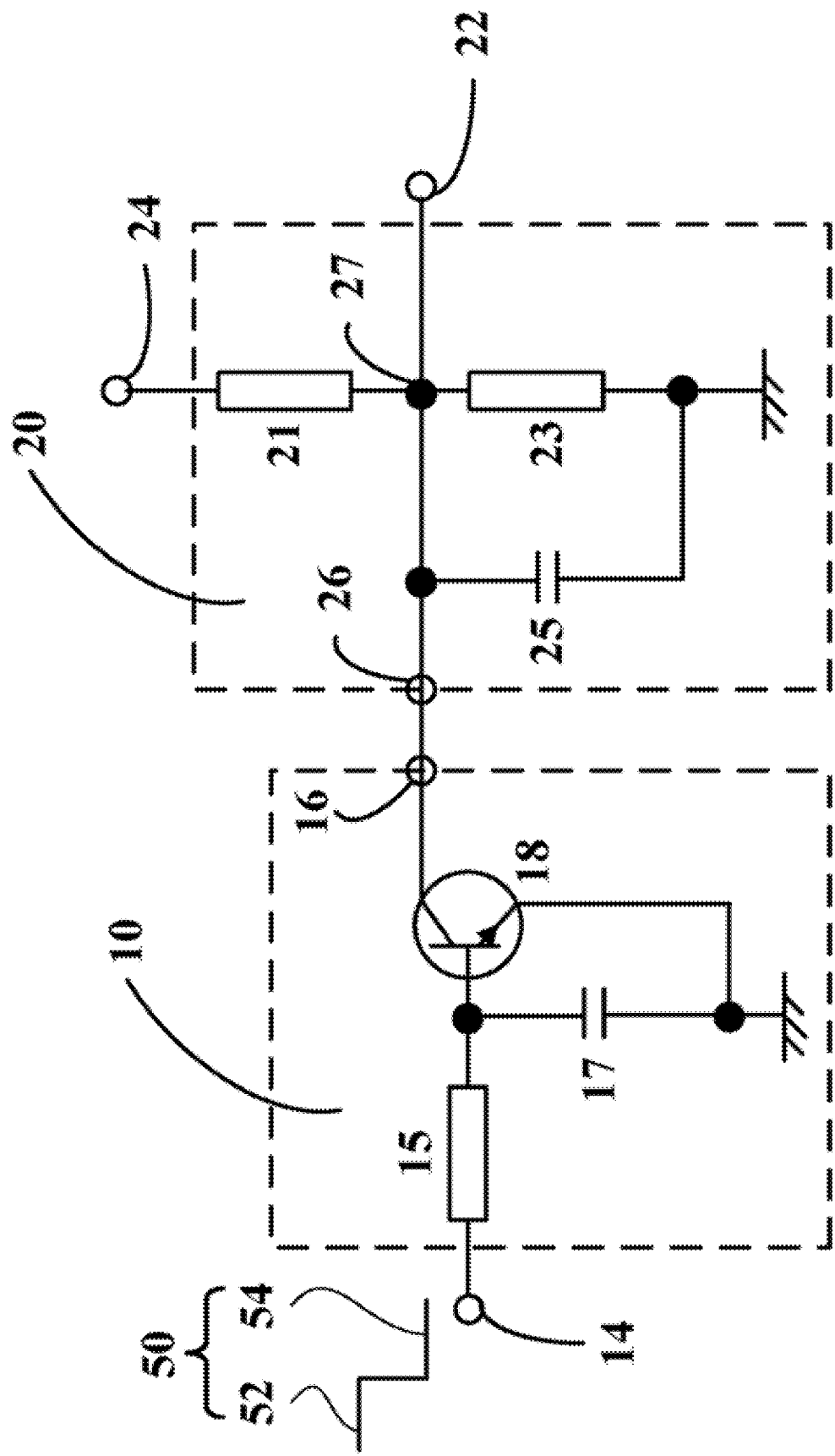
FIG. 2 is a circuit diagram showing detailed structure of the time-delay circuit and the biasing circuit of FIG. 1.

Also referring to FIG. 2, the biasing circuit 20 includes resistors 21, 23 coupled in series between the second input 24 and ground, a capacitor 25 coupled parallel to the resistor 23. An interconnection node 27 between the resistors 21, 23 is coupled to the third input 26 and the second output 22.

When the second input 24 receives power, the capacitor 25 is charged. Therefore, the voltage of the interconnection node 27 increases gradually. When the capacitor 25 has been fully charged, the voltage of the interconnection node 27 reaches a desired level for the amplifier circuit 30 to become actuated.

However, the capacitor 25 does not delay the desired level of the voltage long enough because the capacitor 25 becomes fully charged in a short time. Therefore, the time-delay circuit 10 is necessary to further delay the voltage from reaching the desired level.

The time-delay circuit 10 includes a resistor 15, a capacitor 17, and a bipolar junction transistor (BJT) 18. One end of the resistor 15 is coupled to the first input 14, and the other end of the resistor 15 is coupled to the base of the BJT 18. The emitter of the BJT 18 is grounded, and the collector of the BJT 18 is coupled to the first output 16. The capacitor 17 is coupled between the base and the emitter of the BJT 18.

The first input 14 receives the positive pulse signal 50 when the audio amplifier 100 is powered on. The positive pulse signal 50 includes a primary part 52 that is high, and a secondary part 54 that is low. The BJT 18 is enabled when receiving the primary part 52 of the positive pulse signal 50, and is disabled when receiving the secondary part 54 of the positive pulse signal 50. The capacitor 17 filters the positive pulse signal 50.

In use, when the audio amplifier 100 is powered on, the power is supplied to the biasing circuit 20, and the positive pulse signal 50 is received by the first input 14. The BJT 18 is enabled when the positive pulse signal 50 is high. Therefore, the voltage at the connection node 27 is pulled down to ground, and the power is delivered sequentially through the second input 24, the resistor 21, the connection node 27, the third input 26, the first output 16, the BJT 18, to ground. After a first time period the positive pulse signal 50 changes from high to low, thus, the BJT 18 is disabled. The power directly charges the capacitor 25. After a second time period after the capacitor 25 becomes charged, the voltage of the interconnection node 27 reaches the desired level. Consequently, the amplifier circuit 30 receives the voltage in the desired level via the second output 26, thereby becomes actuated. Because the voltage reaching the desired level is delayed for the first time period and the second time period, the amplifier circuit 30 will not be actuated suddenly, thus, eliminating noise.

Figure 3:
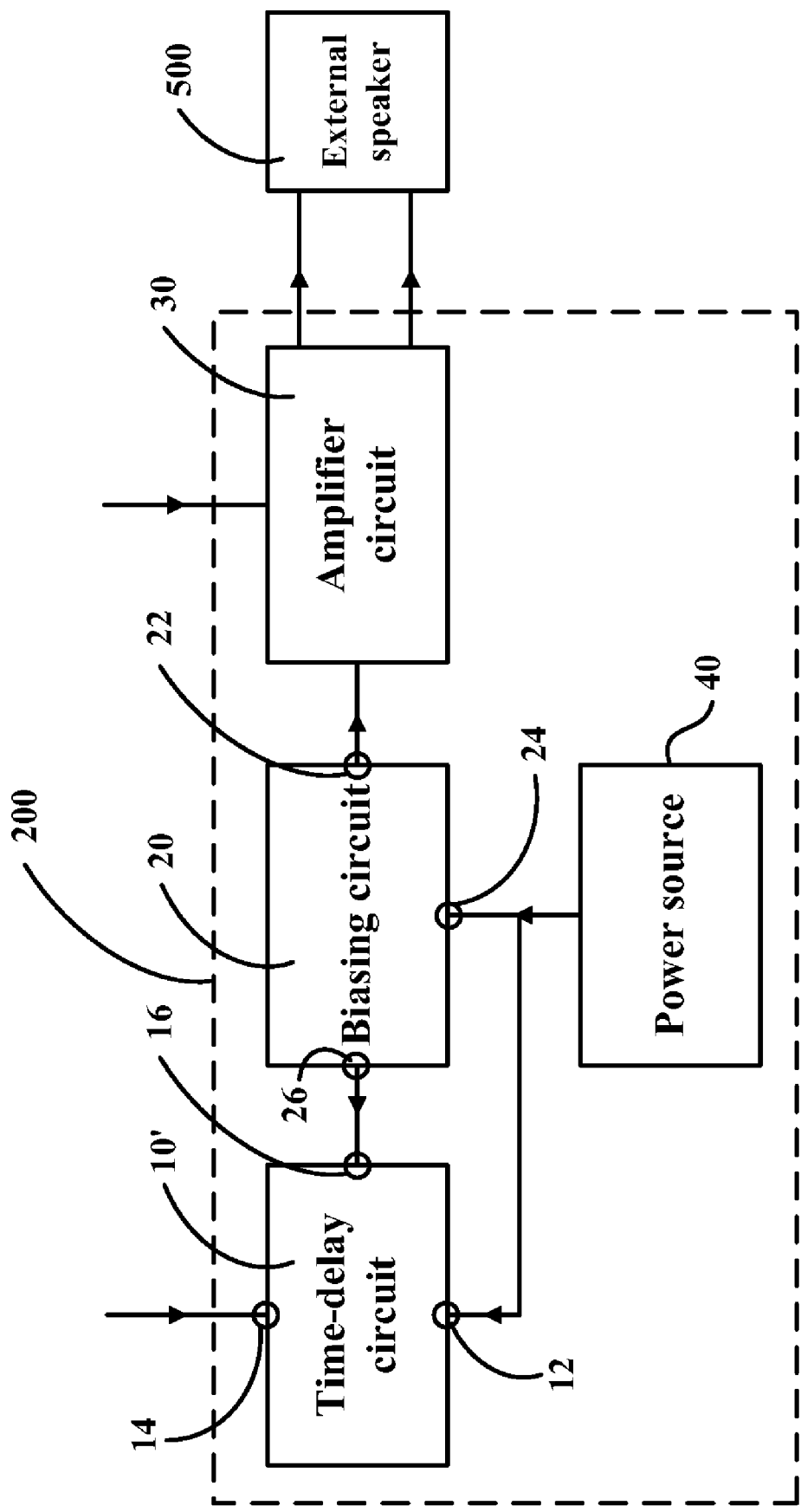
FIG. 3 is a block diagram showing an audio amplifier in accordance with a second exemplary embodiment, and the audio amplifier includes a time-delay circuit and a biasing circuit.

Referring to FIG. 3, an audio amplifier 200 in accordance with a second exemplary embodiment is illustrated. As compared with the audio amplifier 100 (see FIG. 1), the time-delay circuit 10' of the audio amplifier 200 includes an additional input 12 coupled to the power source 40. Therefore, in addition to the biasing circuit 20, the power source 40 also supplies power to the time-delay circuit 10'. In the embodiment, the first input 14 receives a negative pulse signal 60, unlike the positive pulse signal 50 received by the audio amplifier 100. A primary part 62 of the negative pulse signal 60 is low, and the secondary part 64 of the negative pulse signal 60 is high.

Figure 4:
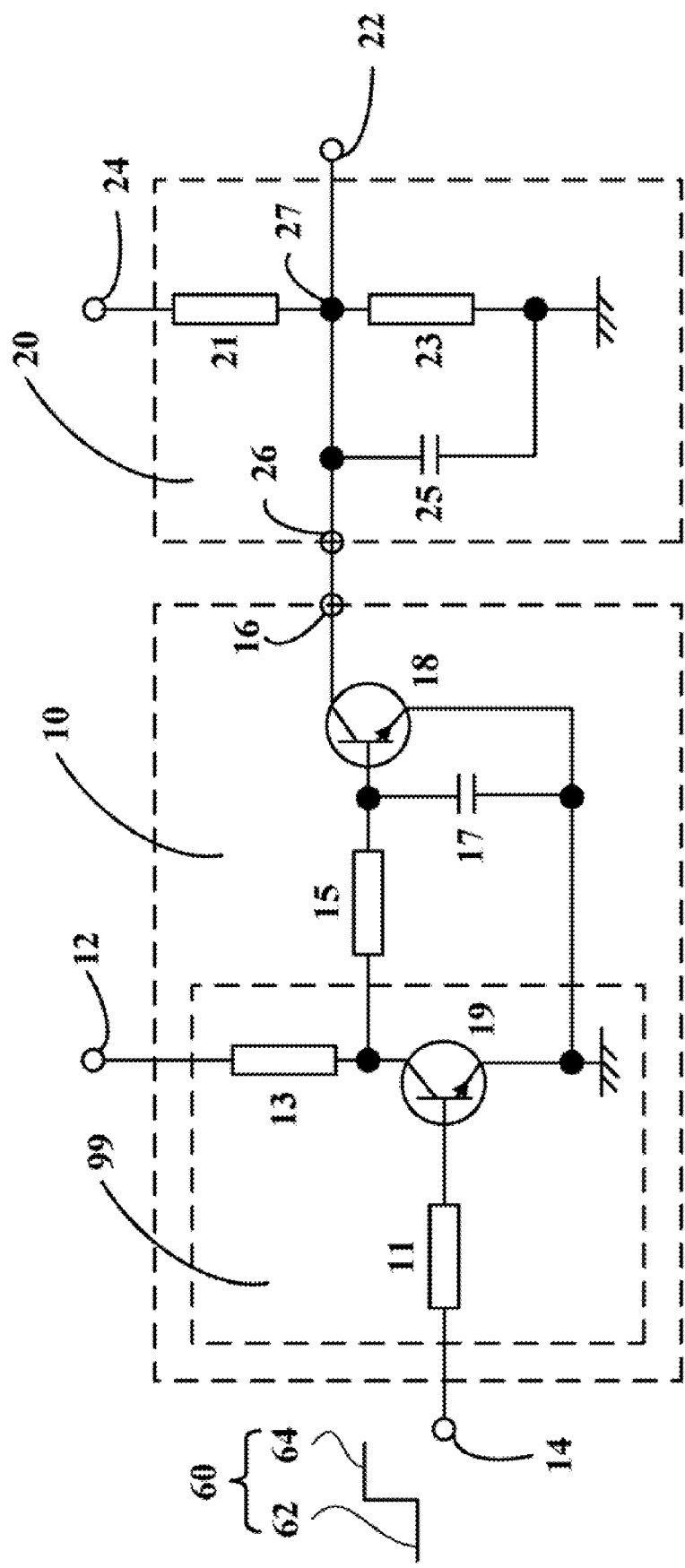
FIG. 4 is a circuit diagram showing detailed structure of the time-delay circuit and the biasing circuit of FIG. 3.

Further referring to FIG. 4, in detailed comparison with the time-delay circuit 10 (see FIG. 2), the time-delay circuit 10' includes an additional switch 99. The additional switch 99 receives the power via the additional input 12, and receives the negative pulse signal 60, and provides a positive pulse signal to the resistor 15.

The additional switch 99 includes resistors 11, 13, and a BJT 19. A first end and a second end of the resistor 11 are respectively coupled to the first input 14 and the base of the BJT 19. The emitter of the BJT 19 is grounded. The collector of the BJT 19 is coupled to the additional input 12 via the resistor 13, and is also coupled to the resistor 15.

In use, when the audio amplifier 200 is powered on, the power is supplied to the biasing circuit 20 and the time-delay circuit 10', and the negative pulse signal 60 is received by the first input 14. The BJT 19 is disabled when the negative pulse signal 60 is low. Therefore, a high voltage is provided to the resistor 15 and further enables the BJT 18. Therefore, the voltage at the connection node 27 is pulled down to ground, and the power is delivered sequentially through the second input 24, the resistor 21, the connection node 27, the third input 26, the first output 16, the BJT 18, to ground.

After a first time period the negative pulse signal 60 changes from low to high. Therefore, the BJT 19 is enabled, and a low voltage is provided to the resistor 15 and disables the BJT 18. The power directly charges the capacitor 25. After a second time period after the capacitor 25 becomes charged, the voltage of the interconnection node 27 reaches the desired level. Consequently, the amplifier circuit 30 receives the voltage in the desired level via the second output 26, thereby becomes actuated. In the embodiment, the high voltage and the low voltage compose of the position signal.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An audio amplifier, comprising:
an amplifier circuit configured for amplifying audio signals;
a biasing circuit configured for providing a bias voltage to the amplifier circuit to actuate the amplifier circuit; and
a time-delay circuit configured for receiving a pulse signal and delaying the bias voltage to avoid a sudden actuation of the amplifier circuit based on the pulse signal; wherein the time-delay circuit comprises a first input for receiving the pulse signal, a first resistor coupled to the first input, a first output coupled to the biasing circuit, a first bipolar junction transistor (BJT) whose base, emitter, collector are respectively coupled to the first resistor, ground, and the first output.

2. The audio amplifier according to claim 1, wherein the biasing circuit comprises a second input coupled to a power source, a second resistor and a third resistor in series coupled between the second input and ground.

3. The audio amplifier according to claim 2, wherein the biasing circuit further comprises an interconnection node between the second resistor and the third resistor, and a second output coupling the interconnection node to the amplifier circuit.

4. The audio amplifier according to claim 3, wherein the biasing circuit further comprises a third input coupling the interconnection node to the first output of the time-delay circuit, and a first capacitor coupled between the interconnection node and ground.

5. The audio amplifier according to claim 4, wherein the pulse signal is a positive pulse signal, and a primary part of the positive pulse signal is high and a secondary part of the positive pulse signal is low.

6. The audio amplifier according to claim 1, wherein the time-delay circuit further comprises a second capacitor coupled between the base of the first BJT and ground.

7. The audio amplifier according to claim 4, wherein the pulse signal is a negative pulse signal, and a primary part of the negative pulse signal is low and a secondary part of the negative pulse signal is high.

8. The audio amplifier according to claim 7, wherein the time-delay circuit further comprises a fourth input coupled to the power source, and an additional switch coupled to the first input, the fourth input, and the first resistor, and the additional switch is used for converting the negative pulse signal to a positive pulse signal and transmitting the positive pulse signal to the first resistor.

9. The audio amplifier according to claim 8, wherein the additional switch comprises a fourth resistor coupled to the first input, a fifth resistor coupled between the fourth input and the first resistor, and a second BJT whose base and emitter are respectively coupled to the fourth resistor and ground, and the collector of the second BJT is coupled to the first resistor and the fifth resistor.

10. The audio amplifier according to claim 8, wherein a primary part of the positive pulse signal is high and a secondary part of the positive pulse signal is low.

* * * * *